United States Patent
Chen et al.

(10) Patent No.: US 11,064,808 B2
(45) Date of Patent: Jul. 20, 2021

(54) RACK SYSTEM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

(*) Notice: Subject to any disclaimer, the term of this patent is extended or adjusted under 35 U.S.C. 154(b) by 0 days.

(21) Appl. No.: 16/592,981

(22) Filed: Oct. 4, 2019

(65) Prior Publication Data

US 2020/0029692 A1     Jan. 30, 2020

Related U.S. Application Data

(63) Continuation of application No. 15/382,040, filed on Dec. 16, 2016, now Pat. No. 10,485,344.

(30) Foreign Application Priority Data

Jun. 16, 2016   (TW) ................................. 105119023

(51) Int. Cl.
| | | |
|---|---|---|
| *A47B 96/02* | (2006.01) | |
| *A47B 88/43* | (2017.01) | |
| *A47B 88/483* | (2017.01) | |
| *H05K 7/14* | (2006.01) | |
| *H05K 7/18* | (2006.01) | |

(52) U.S. Cl.
CPC ............ *A47B 96/025* (2013.01); *A47B 88/43* (2017.01); *A47B 88/483* (2017.01); *H05K 7/1489* (2013.01); *H05K 7/183* (2013.01)

(58) Field of Classification Search
CPC ..... A47B 96/025; A47B 88/483; A47B 88/43; H05K 7/183; H05K 7/1489
See application file for complete search history.

(56) References Cited

U.S. PATENT DOCUMENTS

| | | | | |
|---|---|---|---|---|
| 5,344,227 | A * | 9/1994 | Rock ................... | A47B 88/467 |
| | | | | 312/334.33 |
| 5,595,501 | A * | 1/1997 | Ho ........................ | G11B 33/02 |
| | | | | 312/333 |
| 6,209,979 | B1 * | 4/2001 | Fall ...................... | H05K 7/1489 |
| | | | | 312/319.1 |
| 6,220,456 | B1 * | 4/2001 | Jensen .................. | G06F 1/16 |
| | | | | 211/189 |
| 8,083,298 | B2 | 12/2011 | Henderson et al. | |
| 8,127,940 | B2 | 3/2012 | Henderson et al. | |
| (Continued) | | | | |

*Primary Examiner* — Ko H Chan
(74) *Attorney, Agent, or Firm* — Rosenberg, Klein & Lee

(57) ABSTRACT

A rack system includes a rack, a chassis, and a slide rail assembly. One lateral side of the chassis is provided with a fixing member. The slide rail assembly is mounted on the rack and includes a guide rail having a first segment, a second segment, and a third segment. The first segment is configured for supporting a portion of the chassis. A passage is defined between the second segment and the third segment to allow passage of the fixing member of the chassis.

20 Claims, 11 Drawing Sheets

(56) References Cited

U.S. PATENT DOCUMENTS

| | | | |
|---|---|---|---|
| 8,297,721 B2 * | 10/2012 | Yu | A47B 88/40 |
| | | | 312/333 |
| 8,317,037 B2 | 11/2012 | Henderson et al. | |
| 2001/0008358 A1 * | 7/2001 | Brustle | A47B 88/467 |
| | | | 312/319.1 |
| 2003/0141791 A1 * | 7/2003 | Dubon | H05K 7/1489 |
| | | | 312/333 |
| 2005/0088069 A1 * | 4/2005 | Greenwald | A47B 88/49 |
| | | | 312/333 |
| 2007/0018547 A1 * | 1/2007 | Yang | A47B 88/427 |
| | | | 312/333 |
| 2015/0181753 A1 * | 6/2015 | Murakami | H05K 7/1489 |
| | | | 211/26 |

* cited by examiner

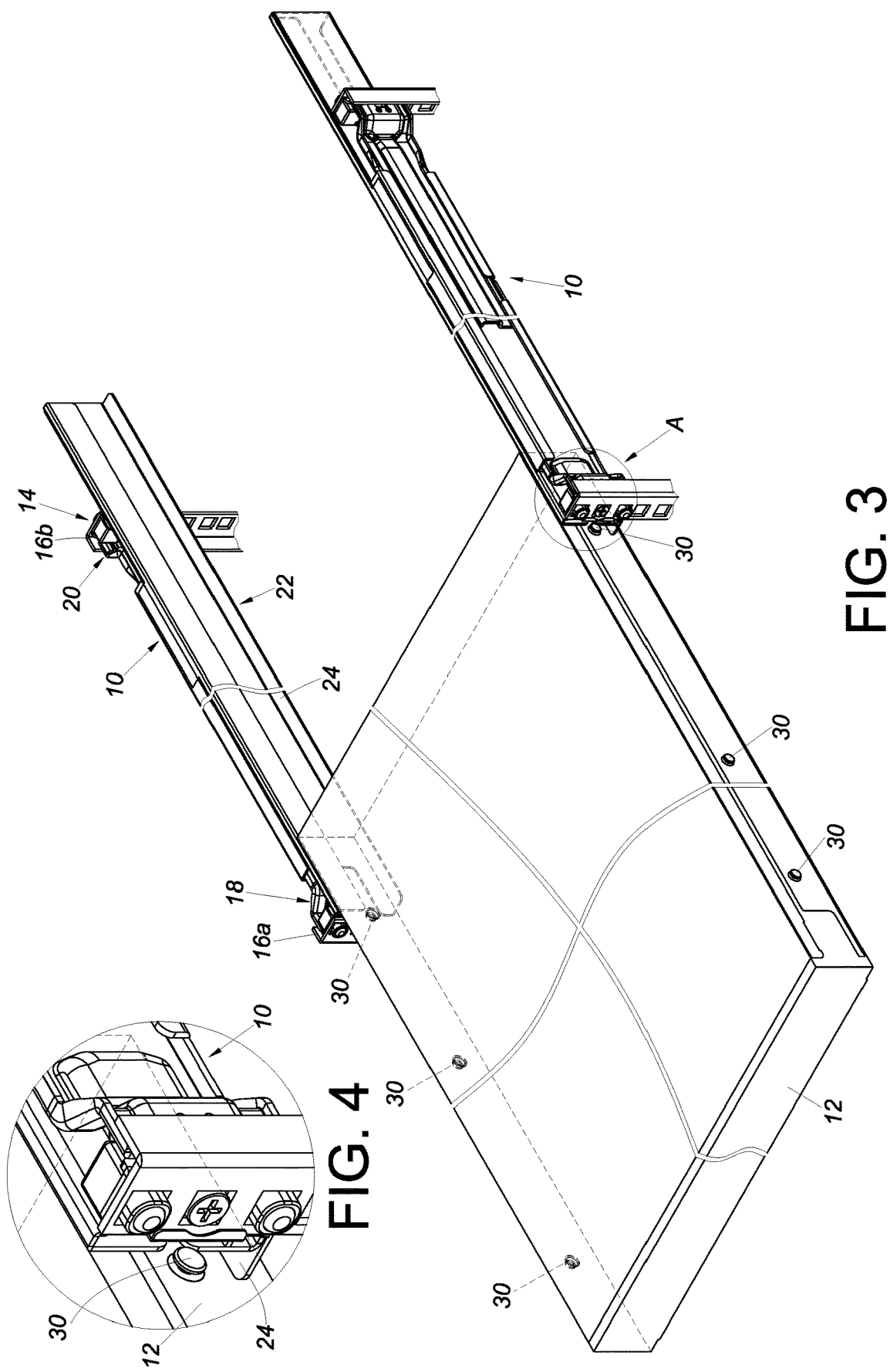

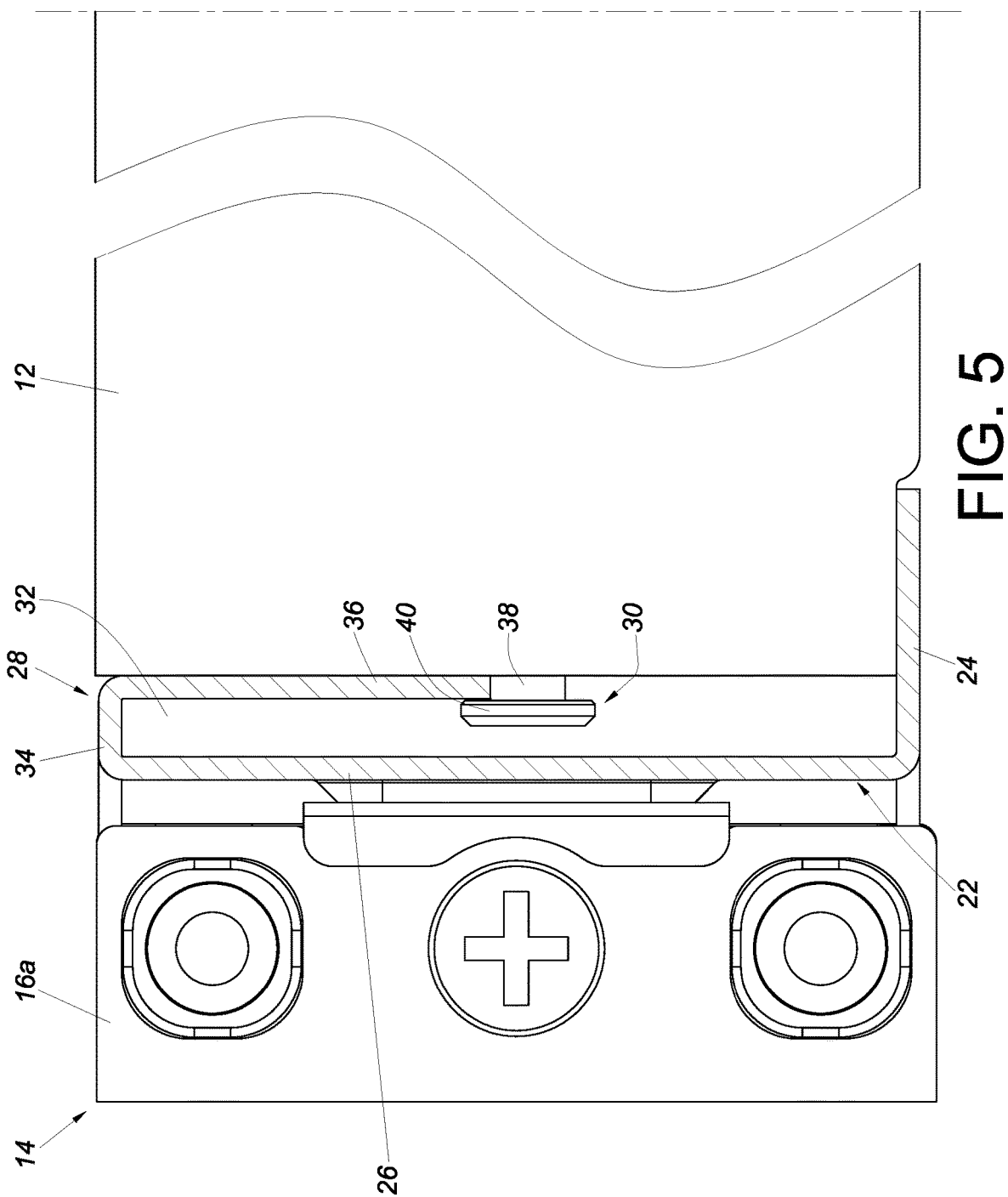

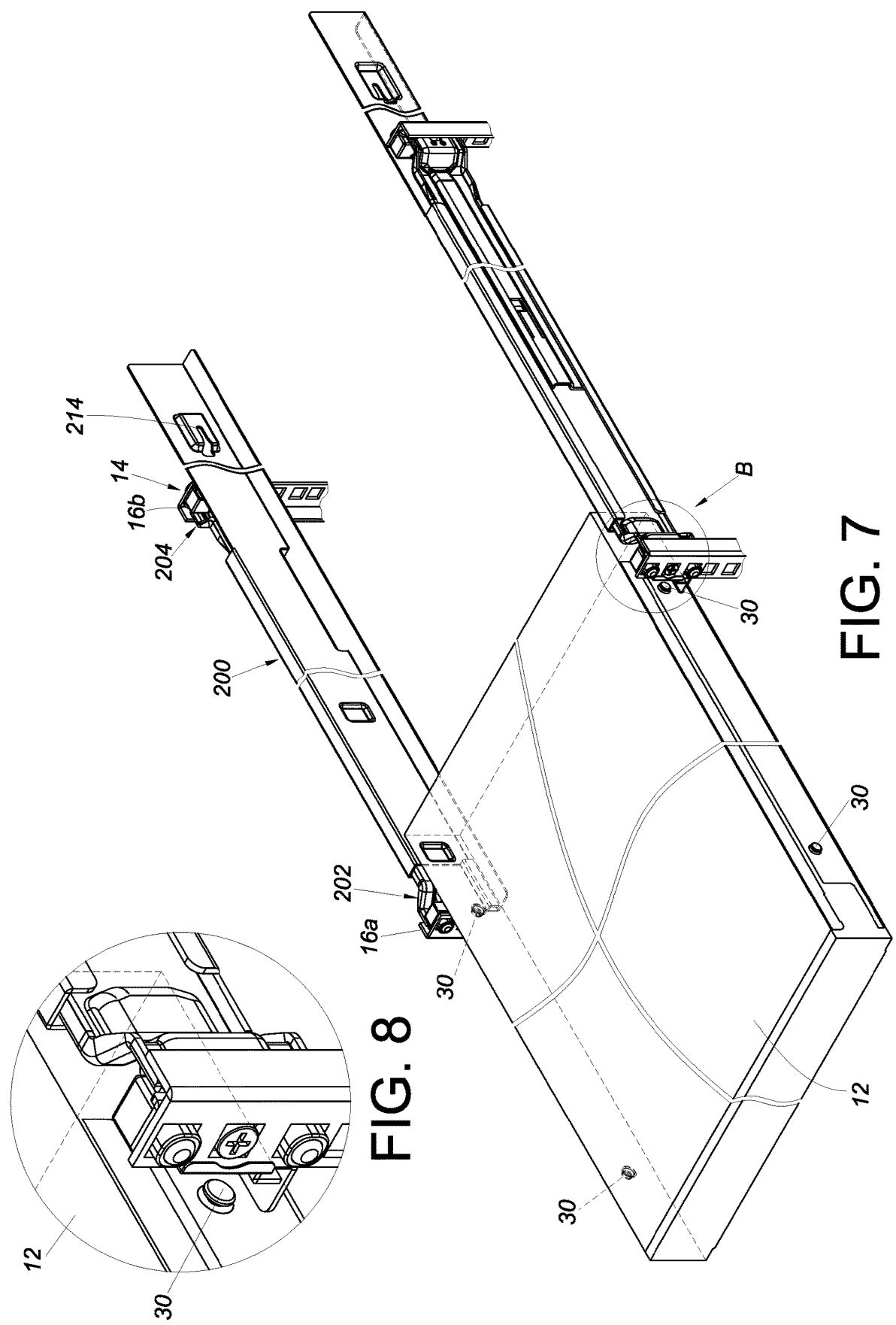

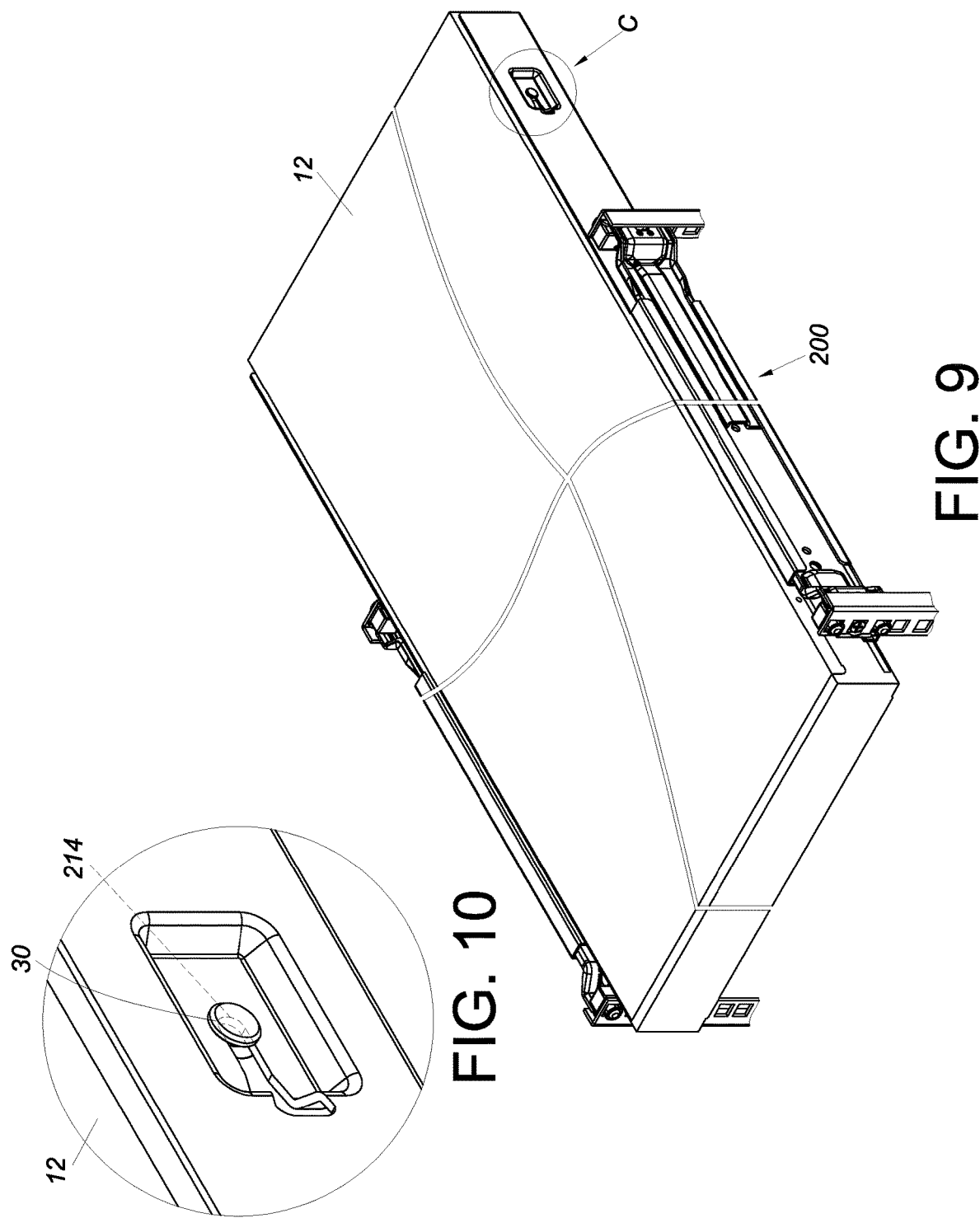

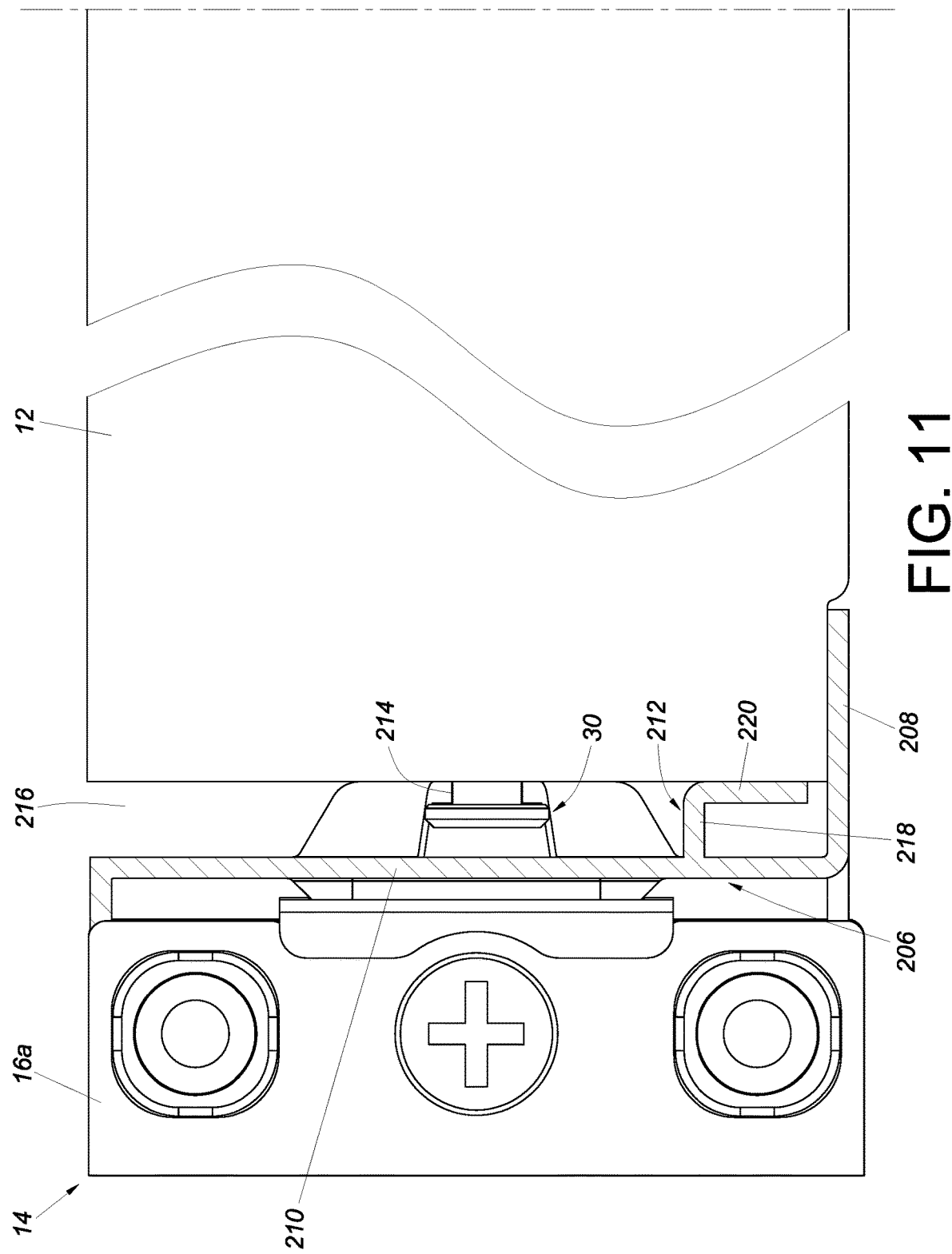

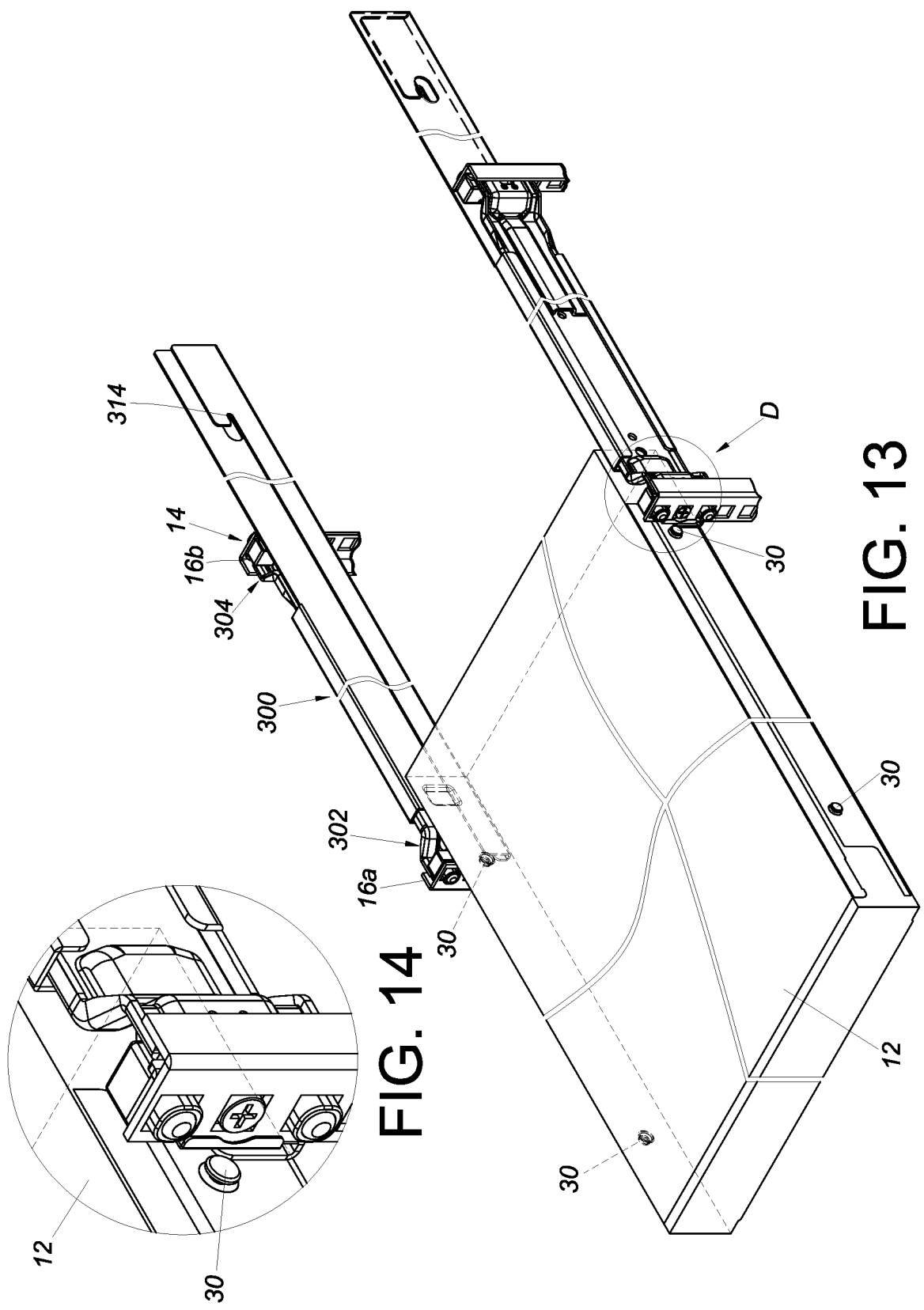

RACK SYSTEM

CROSS-REFERENCE TO RELATED APPLICATIONS

This application is a continuation application of U.S. application Ser. No. 15/382,040, filed on Dec. 16, 2016.

FIELD OF THE INVENTION

The present invention relates to a rack system and more particularly to one with a slide rail assembly which allows a chassis to be mounted rapidly into the rack system and which also supports the chassis securely.

BACKGROUND OF THE INVENTION

In U.S. Pat. No. 6,220,456 B1, Jensen et al. disclose a rack with two posts. A pair of rails are mounted on the posts respectively. Each of the rails includes two ribs, which jointly define a slot. Each slot has one end formed as a wide open end. A chassis has two lateral sides each mounted with a fixing member. The fixing members of the chassis can slide into the slots through the wide open ends respectively in order for the chassis to be supported.

As the foregoing arrangement may have insufficient load bearing capacity, the present invention was conceived as an improvement.

SUMMARY OF THE INVENTION

The present invention relates to a rack system with a slide rail assembly. The slide rail assembly not only allows a chassis to be mounted into the rack system rapidly, but also can support the chassis securely.

According to one aspect of the present invention, a rack system includes a rack, a chassis, and a slide rail assembly. The chassis has a lateral side provided with a fixing member. The slide rail assembly is mounted on the rack and includes a guide rail. The guide rail has a first segment, a second segment, and a third segment. The first segment is configured to support a portion of the chassis. The second segment and the third segment define a passage therebetween to allow passage of the fixing member of the chassis.

In some embodiments according to the foregoing aspect, the first segment of the guide rail is substantially perpendicularly connected to the second segment of the guide rail in order to support the portion of the chassis.

In some embodiments according to the foregoing aspect, the first segment of the guide rail extends substantially perpendicularly from the second segment of the guide rail in order to support the portion of the chassis.

In some embodiments according to the foregoing aspect, the third segment of the guide rail includes a first extension and a second extension. The first extension is connected to the second segment of the guide rail while the second extension is substantially perpendicularly connected to the first extension.

In some embodiments according to the foregoing aspect, the third segment of the guide rail includes a first extension and a second extension, wherein the first extension extends from the second segment of the guide rail while the second extension extends substantially perpendicularly from the first extension. Preferably, the fixing member of the chassis has a first fixing portion and a second fixing portion connected to the first fixing portion. The first fixing portion is connected to the chassis. The second fixing portion has a greater outer diameter than the first fixing portion. When the chassis is mounted on the guide rail, the second extension of the guide rail lies between the second fixing portion of the fixing member and the chassis and supports another portion of the chassis.

In some embodiments according to the foregoing aspect, the first segment of the guide rail has a length, and the second segment and the third segment of the guide rail extend along the length of the first segment of the guide rail.

In some embodiments according to the foregoing aspect, the second segment of the guide rail has a rear end provided with a blocking portion for blocking the fixing member of the chassis.

In some embodiments according to the foregoing aspect, the third segment of the guide rail includes a first wall and a second wall. The first wall is connected to the second segment of the guide rail. The second wall is substantially perpendicularly connected to the first wall.

In some embodiments according to the foregoing aspect, the first wall of the guide rail extends from the second segment of the guide rail, and the second wall extends substantially perpendicularly from the first wall.

In some embodiments according to the foregoing aspect, the first segment of the guide rail has a rear end provided with a blocking portion for blocking the fixing member of the chassis.

In some embodiments according to the foregoing aspect, the third segment of the guide rail is connected between the first segment and the second segment.

In some embodiments according to the foregoing aspect, the third segment of the guide rail extends between the first segment and the second segment.

In some embodiments according to the foregoing aspect, the fixing member of the chassis has a first fixing portion and a second fixing portion connected to the first fixing portion. The first fixing portion is connected to the chassis. The second fixing portion has a greater outer diameter than the first fixing portion. When the chassis is mounted on the guide rail, the first segment of the guide rail supports the first fixing portion of the fixing member of the chassis. Meanwhile, the second fixing portion of the fixing member of the chassis lies in the passage of the guide rail.

BRIEF DESCRIPTION OF THE DRAWINGS

FIG. 3 is a perspective view showing how a chassis is mounted to the front ends of the guide rails of the slide rail assemblies in the first embodiment of the present invention;

FIG. 4 is an enlarged view of the circled area A in FIG. 3;

FIG. 5 is a sectional view showing how a chassis is mounted to the guide rail of a slide rail assembly in the first embodiment of the present invention;

FIG. 7 is a perspective view showing how a chassis is mounted to the front ends of the guide rails of the slide rail assemblies in the second embodiment of the present invention;

FIG. 8 is an enlarged view of the circled area B in FIG. 7;

FIG. 9 is a perspective view showing how a chassis is mounted to the guide rails of the slide rail assemblies in the second embodiment of the present invention;

FIG. 10 is an enlarged view of the circled area C in FIG. 9;

FIG. 11 is a sectional view showing how a chassis is mounted to the guide rail of a slide rail assembly in the second embodiment of the present invention;

FIG. 13 is a perspective view showing how a chassis is mounted to the front ends of the guide rails of the slide rail assemblies in the third embodiment of the present invention;

FIG. 14 is an enlarged view of the circled area D in FIG. 13; and

DETAILED DESCRIPTION OF THE INVENTION

Figure 1:
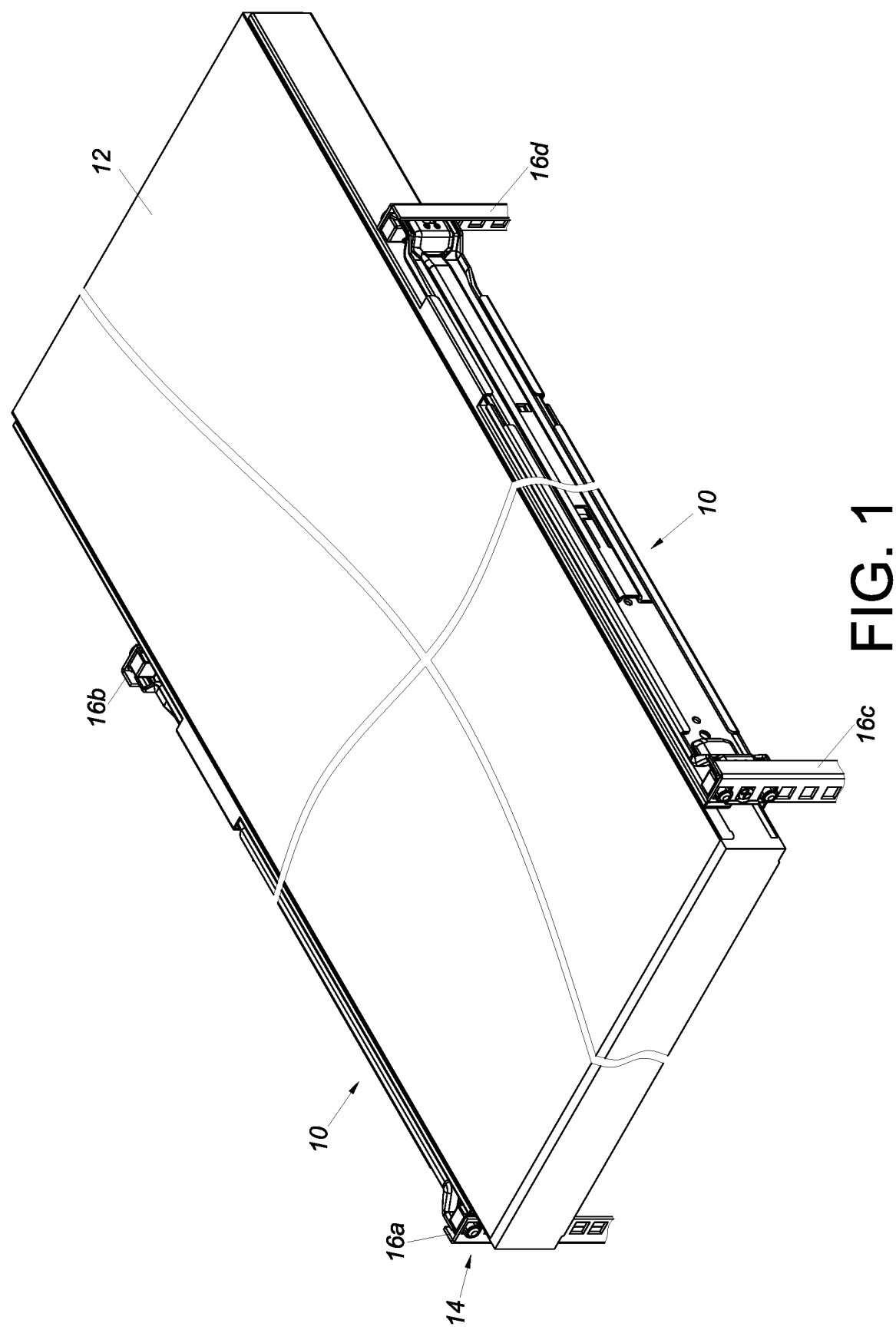
FIG. 1 is a perspective view of a rack system according to the present invention.

Referring to FIG. 1 for the rack system in an embodiment of the present invention, the rack system includes a pair of slide rail assemblies 10 adapted for mounting a chassis 12 to a rack 14. The rack 14 includes a first post 16a, a second post 16b, a third post 16c, and a fourth post 16d. One of the slide rail assemblies 10 is mounted on the first post 16a and the second post 16b of the rack 14 while the other slide rail assembly 10 is mounted on the third post 16c and the fourth post 16d of the rack 14. The chassis 12 has two lateral sides mounted respectively to the pair of slide rail assemblies 10.

Figure 2:
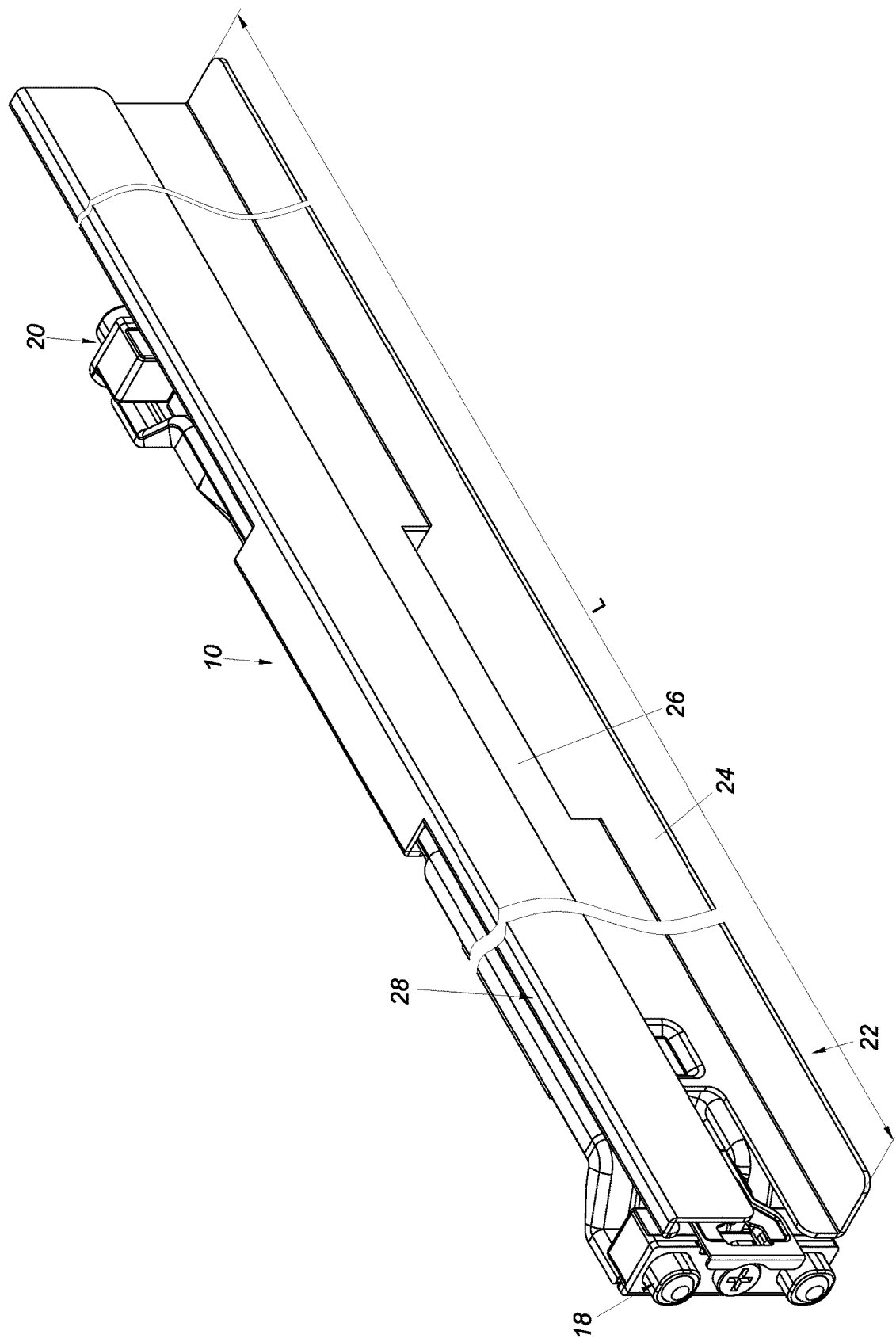
FIG. 2 is a perspective view of a slide rail assembly in the first embodiment of the present invention.
Figure 6:
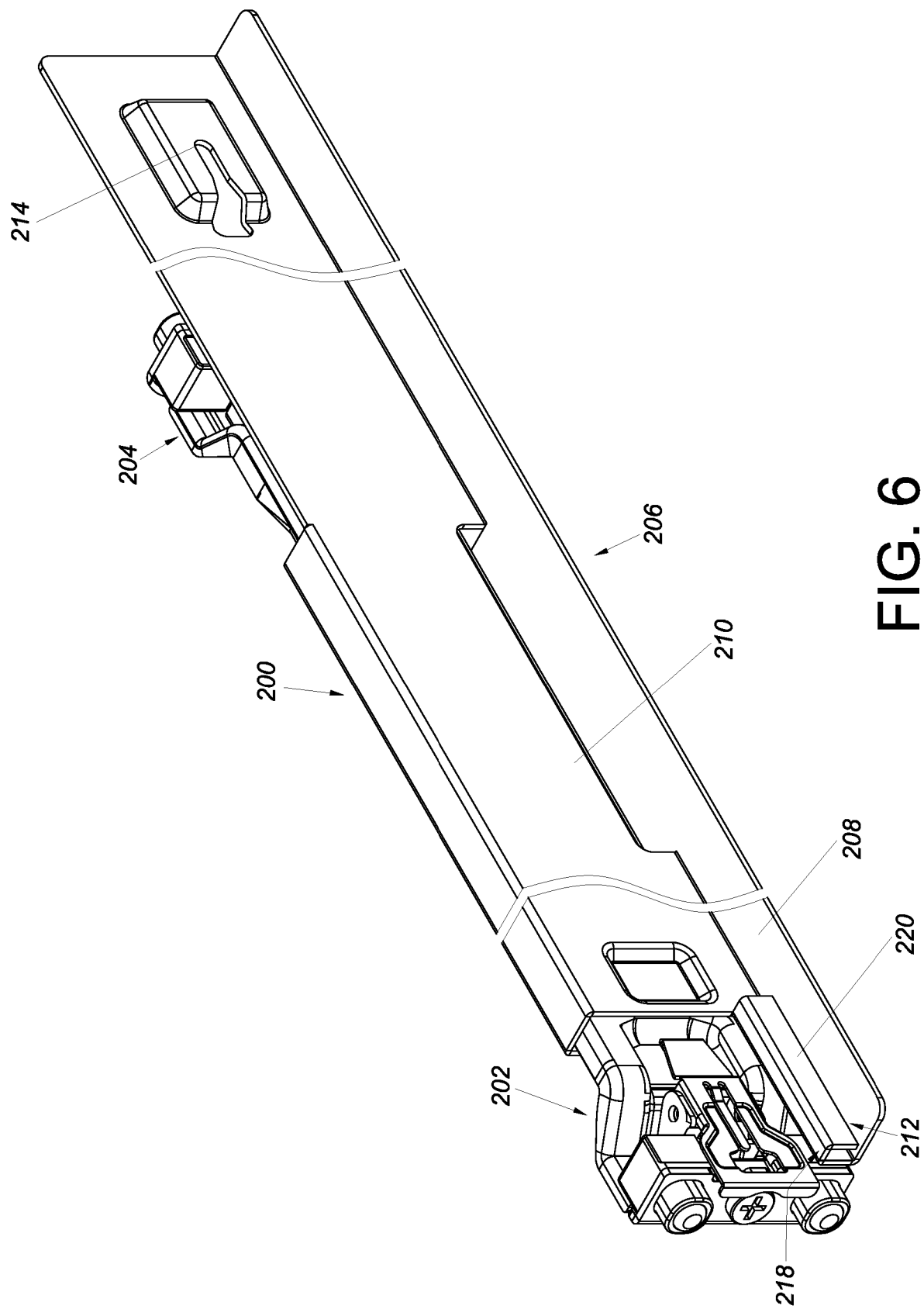
FIG. 6 is a perspective view of a slide rail assembly in the second embodiment of the present invention.

As shown in FIG. 2 to FIG. 4, each slide rail assembly 10 in the first embodiment of the present invention includes a first bracket 18 and a second bracket 20, which are configured to be mounted to the first post 16a and the second post 16b of the rack 14 respectively (see FIG. 1 for the first post 16a and the second post 16b). Each slide rail assembly 10 further includes a guide rail 22, which has a first segment 24, a second segment 26, and a third segment 28. In addition, the two lateral sides of the chassis 12 are each mounted with one or a plurality of fixing members 30. In this embodiment, plural fixing members 30 are provided on each of the two lateral sides of the chassis 12.

Referring to FIG. 5, the first segment 24 of the guide rail 22 is configured to support a portion (e.g., a bottom portion) of the chassis 12. The second segment 26 and the third segment 28 define a passage 32 therebetween, through which the corresponding fixing members 30 can pass. The first segment 24 of the guide rail 22 is substantially perpendicularly connected to the second segment 26 of the guide rail 22 in order to support the aforesaid portion of the chassis 12.

In a preferred embodiment, the first segment 24 of the guide rail 22 extends substantially perpendicularly from the second segment 26 of the guide rail 22 in order to support the aforesaid portion of the chassis 12.

In a preferred embodiment, the third segment 28 of the guide rail 22 includes a first extension 34 and a second extension 36. The first extension 34 is connected to the second segment 26 of the guide rail 22. The second extension 36 is substantially perpendicularly connected to the first extension 34.

In a preferred embodiment, the first extension 34 extends from the second segment 26 of the guide rail 22 while the second extension 36 extends substantially perpendicularly from the first extension 34.

In a preferred embodiment, each fixing member 30 of the chassis 12 has a first fixing portion 38 and a second fixing portion 40 connected to the first fixing portion 38. The first fixing portion 38 is connected to the chassis 12. The second fixing portion 40 has a greater outer diameter than the first fixing portion 38. When the chassis 12 is mounted on the guide rails 22, with continued reference to FIG. 5, the second extension 36 of each guide rail 22 lies between the second fixing portion 40 of each corresponding fixing member 30 and the chassis 12 and supports another portion (e.g., a sidewall) of the chassis 12. This arrangement allows the chassis 12 to be mounted rapidly and be securely supported by the guide rails 22 of the slide rail assemblies 10.

In a preferred embodiment, referring back to FIG. 2, the first segment 24 of the guide rail 22 has a length L, and the second segment 26 and the third segment 28 of the guide rail 22 extend along the length L of the first segment 24 of the guide rail 22.

Referring to FIG. 6 to FIG. 10 for the slide rail assemblies 200 in the second embodiment of the present invention, each slide rail assembly 200 includes a first bracket 202 and a second bracket 204, which are configured to be mounted to the first post 16a and the second post 16b of the rack 14 respectively (see FIG. 1 for the first post 16a and the second post 16b). Each slide rail assembly 200 further includes a guide rail 206 with a first segment 208, a second segment 210, and a third segment 212. The second segment 210 of each guide rail 206 has a rear end provided with a blocking portion 214 for blocking the corresponding fixing member 30 of the chassis 12.

As shown in FIG. 11, the first segment 208 of the guide rail 206 supports a portion (e.g., a bottom portion) of the chassis 12. A passage 216 is defined between the second segment 210 and the third segment 212 to allow passage of the corresponding fixing members 30 of the chassis 12. The first segment 208 of the guide rail 206 is substantially perpendicularly connected to the second segment 210 of the guide rail 206 in order to support the aforesaid portion of the chassis 12. Once the chassis 12 is pushed into the guide rail 206 completely, the blocking portion 214 at the rear end of the second segment 210 of the guide rail 206 blocks the corresponding fixing member 30 of the chassis 12. This arrangement allows the chassis 12 to be mounted rapidly and be securely supported by the guide rails 206 of the slide rail assemblies 200.

In a preferred embodiment, the first segment 208 of the guide rail 206 extends substantially perpendicularly from the second segment 210 of the guide rail 206 in order to support the aforesaid portion of the chassis 12.

In a preferred embodiment, referring to FIG. 11, the third segment 212 of the guide rail 206 includes a first wall 218 and a second wall 220. The first wall 218 is connected to the second segment 210 of the guide rail 206 while the second wall 220 is substantially perpendicularly connected to the first wall 218.

In a preferred embodiment, with continued reference to FIG. 11, the first wall 218 of the guide rail 206 extends from the second segment 210 of the guide rail 206, and the second wall 220 extends substantially perpendicularly from the first wall 218.

Figure 12:
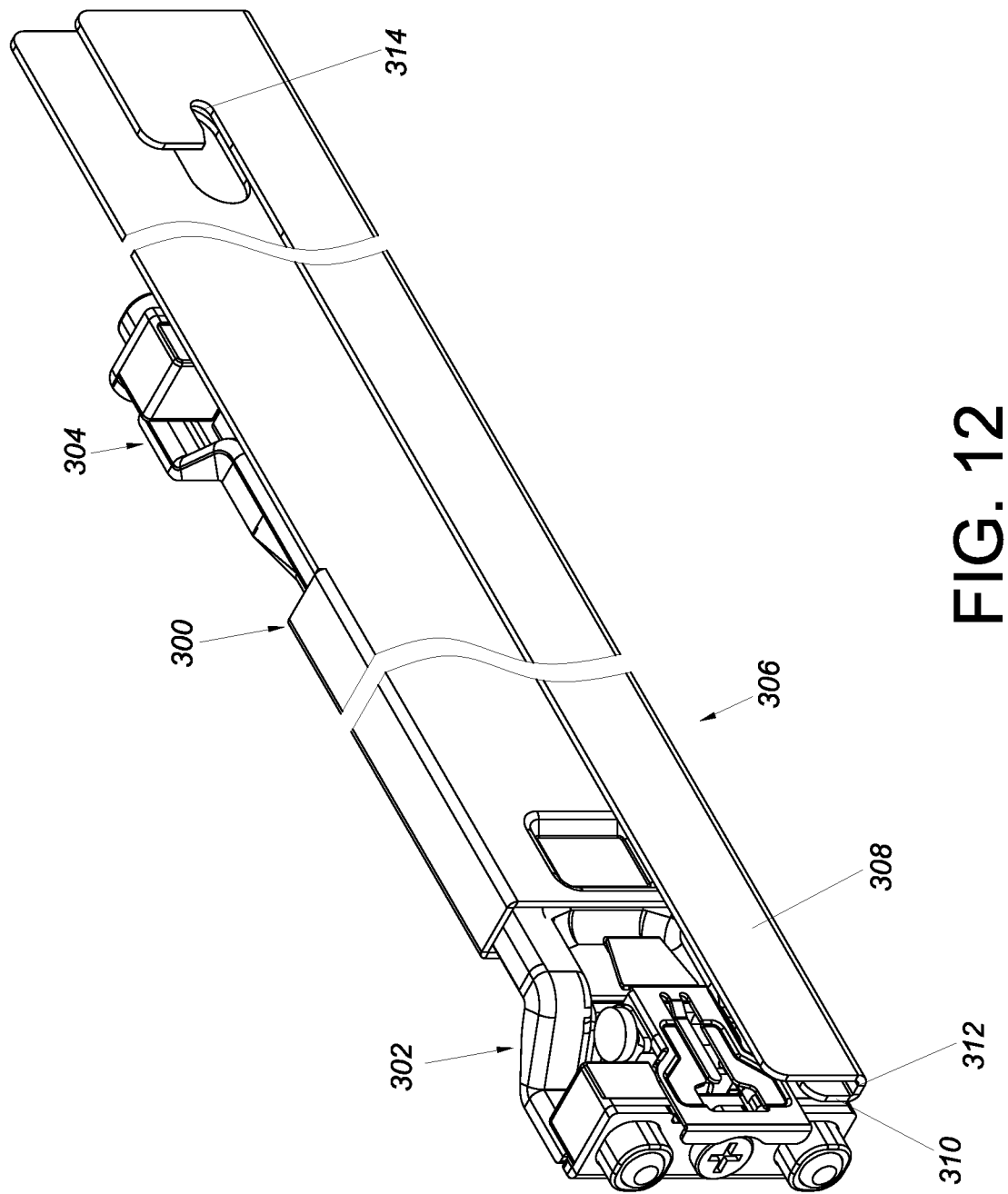
FIG. 12 is a perspective view of a slide rail assembly in the third embodiment of the present invention.

FIG. 12 to FIG. 14 show the slide rail assemblies 300 in the third embodiment of the present invention. Each slide rail assembly 300 includes a first bracket 302 and a second bracket 304, which are configured to be mounted to the first post 16a and the second post 16b of the rack 14 respectively (see FIG. 1 for the first post 16a and the second post 16b). Each slide rail assembly 300 further includes a guide rail 306 with a first segment 308, a second segment 310, and a third segment 312. The first segment 308 of each guide rail 306 has a rear end provided with a blocking portion 314 for blocking the corresponding fixing member 30 of the chassis 12.

Figure 15:
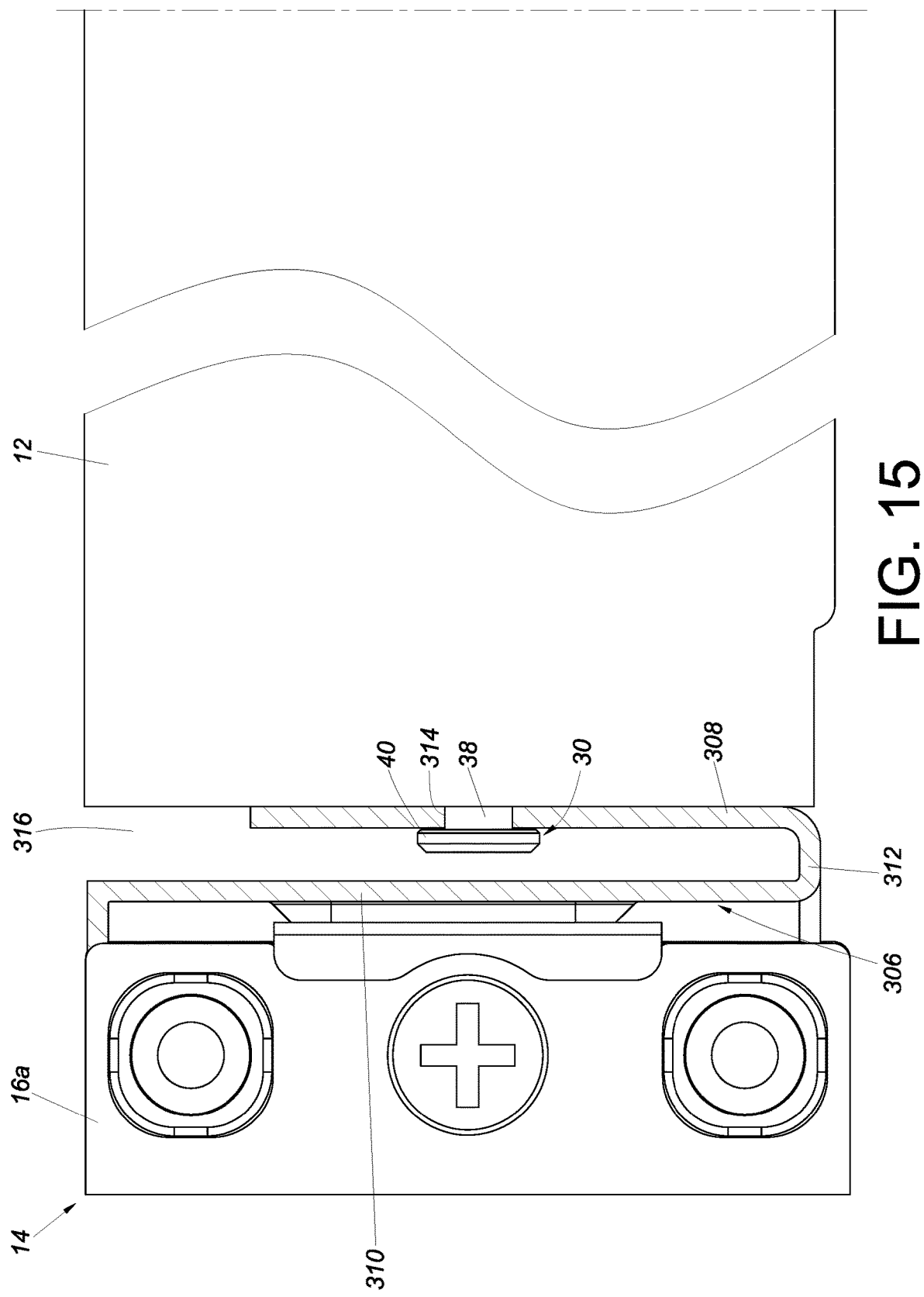
FIG. 15 is a sectional view showing how a chassis is mounted to the guide rail of a slide rail assembly in the third embodiment of the present invention.

As shown in FIG. 15, the first segment 308 of the guide rail 306 supports a portion (e.g., a sidewall) of the chassis 12. A passage 316 is defined between the second segment 310 and the third segment 312 to allow passage of the corresponding fixing members 30 of the chassis 12. The third segment 312 of the guide rail 306 is connected between the first segment 308 and the second segment 310.

In a preferred embodiment, the third segment 312 of the guide rail 306 extends between the first segment 308 and the second segment 310.

In a preferred embodiment, with continued reference to FIG. 15, the first segment 308 of the guide rail 306 supports the first fixing portion 38 of each corresponding fixing member 30 of the chassis 12 when the chassis 12 is mounted on the guide rail 306; meanwhile, the second fixing portion 40 of each corresponding fixing member 30 of the chassis 12 is in the passage 316 of the guide rail 312. Once the chassis 12 is pushed into the guide rail 306 completely, the blocking portion 314 at the rear end of the first segment 308 of the guide rail 306 blocks the corresponding fixing member 30 of the chassis 12. This arrangement allows the chassis 12 to be mounted rapidly and be securely supported by the guide rails 306 of the slide rail assemblies 300.

While the present invention has been disclosed by way of the foregoing preferred embodiments, it should be understood that the embodiments described herein are not restrictive of the scope of the invention. The scope of patent protection sought by the applicant is defined by the appended claims.

What is claimed is:

1. A rack system, comprising:
   a rack;
   a chassis having a lateral side provided with a fixing member; and
   a slide rail assembly mounted on the rack, the slide rail assembly including a guide rail, the guide rail having a first segment, a second segment, and a third segment, wherein the first segment is configured for supporting a portion of the chassis, and the second segment and the third segment define a passage therebetween to allow extension of the fixing member of the chassis therein;
   wherein the third segment of the guide rail extends laterally from the second segment to maintain a lateral surface bearing against the lateral side of the chassis when supported by the first segment, and the fixing member of the chassis when extending into the passage opposes the second segment of the guide rail while remaining laterally spaced therefrom.

2. The rack system of claim 1, wherein the first segment of the guide rail is substantially perpendicularly connected to the second segment of the guide rail in order to support the portion of the chassis.

3. The rack system of claim 1, wherein the first segment of the guide rail extends substantially perpendicularly from the second segment of the guide rail in order to support the portion of the chassis.

4. The rack system of claim 2, wherein the third segment of the guide rail includes a first extension and a second extension, the first extension is connected to the second segment of the guide rail, and the second extension is substantially perpendicularly connected to the first extension.

5. The rack system of claim 3, wherein the third segment of the guide rail includes a first extension and a second extension, the first extension extends from the second segment of the guide rail, and the second extension extends substantially perpendicularly from the first extension to define the lateral surface bearing against the lateral side of the chassis.

6. The rack system of claim 5, wherein the fixing member of the chassis has a first fixing portion and a second fixing portion connected to the first fixing portion; the first fixing portion is connected to the chassis; the second fixing portion has a greater outer diameter than the first fixing portion; and when the chassis is mounted on the guide rail, the second extension of the guide rail is disposed between the second fixing portion of the fixing member and the chassis and supports another portion of the chassis.

7. The rack system of claim 1, wherein the first segment of the guide rail has a length, and the second segment and the third segment of the guide rail extend along the length of the first segment of the guide rail.

8. A rack system, comprising:
   a rack;
   a chassis having a lateral side provided with a fixing member; and
   a slide rail assembly mounted on the rack, the slide rail assembly including a guide rail, the guide rail having a first segment, a second segment, and a third segment, wherein the first segment is configured for supporting a portion of the chassis;
   wherein the second segment of the guide rail has a rear end provided with a blocking portion for retentive engagement by the fixing member of the chassis;
   wherein the third segment of the guide rail extends laterally from the second segment to maintain a lateral surface bearing against the lateral side of the chassis when supported by the first segment, and the fixing member of the chassis when retentively engaging the blocking portion opposes the second segment of the guide rail while remaining laterally spaced therefrom.

9. The rack system of claim 8, wherein the third segment of the guide rail includes a first wall and a second wall, the first wall is connected to the second segment of the guide rail, and the second wall is substantially perpendicularly connected to the first wall.

10. The rack system of claim 8, wherein the third segment of the guide rail includes a first wall and a second wall, the first wall of the guide rail extends from the second segment of the guide rail, and the second wall extends substantially perpendicularly from the first wall.

11. A rack system, comprising:
   a rack;
   a chassis having a lateral side provided with a fixing member; and
   a slide rail assembly mounted on the rack, the slide rail assembly including a first bracket, a second bracket, and a guide rail, the guide rail having a length that extends beyond a distance defined between the first bracket and the second bracket, the guide rail including a first segment, a second segment, and a third segment, the first, second, and third segments being integrally formed, wherein the first segment is configured for supporting a portion of the chassis, and the second segment and the third segment define a passage therebetween to allow extension of the fixing member of the chassis therein;
   wherein the third segment of the guide rail extends laterally from the second segment to maintain a lateral surface bearing against the lateral side of the chassis when supported by the first segment, and the fixing member of the chassis when extending into the passage opposes the second segment of the guide rail while remaining laterally spaced therefrom.

12. The rack system of claim 11, wherein the first segment of the guide rail is substantially perpendicularly connected to the second segment of the guide rail in order to support the portion of the chassis.

13. The rack system of claim 11, wherein the first segment of the guide rail extends substantially perpendicularly from the second segment of the guide rail in order to support the portion of the chassis.

14. The rack system of claim 12, wherein the third segment of the guide rail includes a first extension and a second extension, the first extension is connected to the second segment of the guide rail, and the second extension is substantially perpendicularly connected to the first extension.

15. The rack system of claim 13, wherein the third segment of the guide rail includes a first extension and a second extension, the first extension extends from the second segment of the guide rail, and the second extension extends substantially perpendicularly from the first extension to define the lateral surface bearing against the lateral side of the chassis.

16. The rack system of claim 15, wherein the fixing member of the chassis has a first fixing portion and a second fixing portion connected to the first fixing portion; the first fixing portion is connected to the chassis; the second fixing portion has a greater outer diameter than the first fixing portion; and when the chassis is mounted on the guide rail, the second extension of the guide rail is disposed between the second fixing portion of the fixing member and the chassis and supports another portion of the chassis.

17. The rack system of claim 11, wherein the first segment of the guide rail has a length, and the second segment and the third segment of the guide rail extend along the length of the first segment of the guide rail.

18. The rack system of claim 11, wherein the second segment of the guide rail has a rear end provided with a blocking portion for blocking the fixing member of the chassis.

19. The rack system of claim 18, wherein the third segment of the guide rail includes a first wall and a second wall, the first wall is connected to the second segment of the guide rail, and the second wall is substantially perpendicularly connected to the first wall.

20. The rack system of claim 19, wherein the third segment of the guide rail includes a first wall and a second wall, the first wall of the guide rail extends from the second segment of the guide rail, and the second wall extends substantially perpendicularly from the first wall.

* * * * *